United States Patent [19]
Gordon

[11] Patent Number: 4,714,981
[45] Date of Patent: Dec. 22, 1987

[54] COVER FOR A SEMICONDUCTOR PACKAGE

[75] Inventor: Robert B. Gordon, Springfield Township, Delaware County, Pa.

[73] Assignee: RCA Corporation, Princeton, N.J.

[21] Appl. No.: 849,901

[22] Filed: Apr. 9, 1986

[51] Int. Cl.$^4$ .............................................. H05K 5/03
[52] U.S. Cl. ...................... 361/400; 361/395; 174/52 FP; 357/80; 357/51; 357/75
[58] Field of Search ................ 357/51, 74, 75, 80; 361/395, 400, 401, 402; 174/68.5, 52 FP

[56] References Cited

U.S. PATENT DOCUMENTS

| | | | |
|---|---|---|---|
| 3,349,481 | 10/1967 | Karp | 174/52 FP |
| 3,374,400 | 3/1968 | Tabuchi et al. | 174/52 FP |
| 4,249,196 | 2/1981 | Durney | 357/74 |
| 4,342,069 | 7/1982 | Link | 361/401 |
| 4,454,529 | 6/1984 | Philofsky et al. | 357/75 |
| 4,539,622 | 9/1985 | Akasaki | 361/401 |
| 4,598,307 | 7/1986 | Wakabayashi et al. | 357/75 |
| 4,639,826 | 1/1987 | Val et al. | 361/272 |

OTHER PUBLICATIONS

Decoupling II, AVX Ceramics.

*Primary Examiner*—A. D. Pellinen
*Assistant Examiner*—H. L. Williams
*Attorney, Agent, or Firm*—Clement A. Berard, Jr.; Raymond E. Smiley

[57] ABSTRACT

A cover for a semiconductor package includes a composite layer on its upper most surface containing a passive circuit. The passive circuit may include a number of passive components to fulfill various functions such as capacitive coupling and decoupling, resistive pull-up and pull-down, et al. Appropriate terminal points of the passive circuit terminate in contacts which are disposed on the top surface of the composite layer. Terminals are attached to the contacts for interconnecting the passive circuit with terminal leads of the semiconductor package or other circuit components.

8 Claims, 9 Drawing Figures

COVER FOR A SEMICONDUCTOR PACKAGE

The present invention relates to packages containing semiconductor devices such as integrated circuits and more particularly to the covers for such packages.

BACKGROUND OF THE INVENTION

Semiconductor integrated circuits (ICs) typically utilize a number of passive components to fulfill various functions such as capacitive coupling and decoupling, resistive pull-up and pull-down, resistive voltage division, and resistive current limiting. These passive components are usually discrete components attached to an interconnection medium, such as a printed circuit board, in close proximity to an associated IC package. Interconnections between the integrated circuit and the passive components are effected by metalized conductors on the printed circuit board.

Current trends in semiconductor device technology have evolved complete functions as well as multiple functions in IC and very large scale integrated circuit (VLSI) packages. Such trends have resulted in a substantial decrease in the overall size of the physical package containing these functional circuits. This, of course, has the desirable affect of smaller and lighter end products. Further decreases in the overall size of these packages may be achieved by reducing the area of the interconnection media that is utilized by the passive components. One way to partly accomplish this, that is presently in use, is to place a multilayer ceramic decoupling capacitor directly under the IC chip inside the IC package. The capacitor is directly wired to appropriate terminals within the package. While this structure is effective in saving space, it does not permit flexibility in use of the passive component with a particular integrated circuit. That is, the passive component is hard wired to the IC in a particular way prior to completing fabrication of the IC package and may not be altered later for an application requiring a different arrangement. Further, since the available space directly under the IC chip in a typical package is quite limited, so is the usefulness of this space for housing multiple passive components.

What is needed, is a structure whereby multiple passive components are disposed on, or in, the IC package rather than on the interconnection medium and arranged so that they may be selectively interconnected to the IC package leads at the time of assembly to the interconnection medium.

SUMMARY OF THE INVENTION

The present invention relates to a cover for a semiconductor package having a passive circuit disposed within a portion of the cover. The cover includes a body having a major surface which is substantially planar and an attaching surface opposite the planar surface for attaching to the semiconductor package. A composite layer is disposed on the major surface of the body and contains a passive circuit including at least one electrical contact having a terminal attached thereto.

DESCRIPTION OF THE PREFERRED EMBODIMENT

Figure 1:
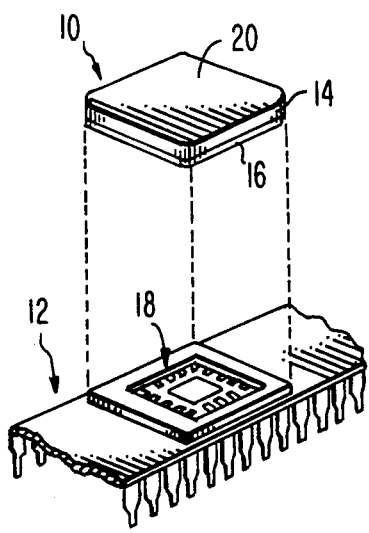
FIG. 1 is an isometric view of a semiconductor package having a prior art cover.
Figure 2:
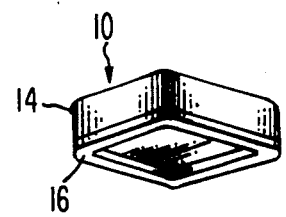
FIG. 2 is an isometric view of the cover of FIG. 1.

FIGS. 1 and 2 depict a prior art cover 10 for a dual-in-line semiconductor IC package 12. The cover 10 includes a body 14 which may be of metal or ceramic material. The side of the body 14 which is attached to the package 12 may include a glass frit or metalized frame 16 which is used to seal the semiconductor die cavity 18. The body 14 includes a substantially planar surface 20 opposite the metalized frame 16.

Figure 3:
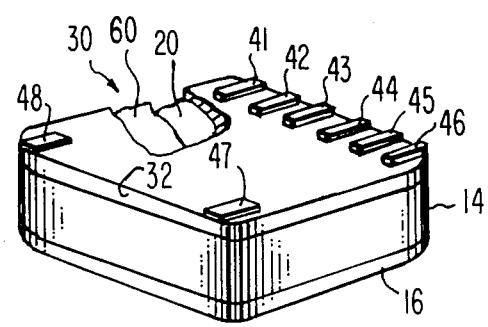
FIG. 3 is an isometric view of a cover illustrating the teachings of the present invention.
Figure 4:
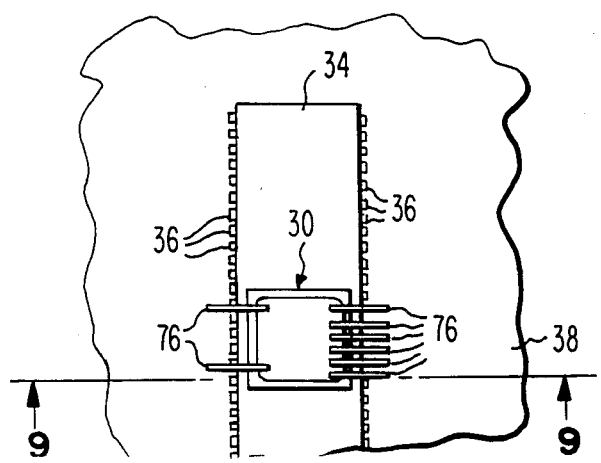
FIG. 4 is a partial plan view of a printed circuit board including a semiconductor package having the cover of FIG. 3.

A cover 30 which incorporates the teachings of the present invention is depicted in FIG. 3. The cover 30 is similar to the prior art cover 10 in that it includes a body 14 having a substantially planar surface 20 and may have a glass frit or metalized frame 16. However, the cover 30 also includes a composite layer 32 which is disposed on the planar surface 20. The composite layer 32 contains a passive circuit including one or more passive components such as capacitors or resistors. As best seen in FIG. 4, the cover 30 is attached to a semiconductor package 34 which, in the present example, is a dual-in-line semiconductor IC package having a plurality of leads 36. The leads 36 project through holes in a printed circuit board 38 and are soldered in place in the usual manner. The cover 30 may be attached by any suitable means well known in the art such as by welding, brazing, or soldering.

Figure 5:
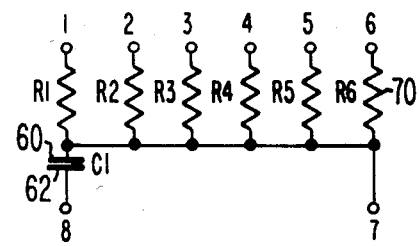
FIG. 5 is a schematic diagram of a passive circuit.

A typical passive circuit, which is contained in the composite layer 32 of the present example, is schematically shown in FIG. 5. The passive circuit includes a decoupling capacitor C1 and six pull-down or pull-up resistors R1 through R6. The six resistors R1 through R6 have one of each of their leads terminating at the points 1 through 6, respectively, while the other leads are common with one plate of the capacitor C1 and terminate at the point 7. The other plate of the capacitor C1 terminates at the point 8.

Figure 6:
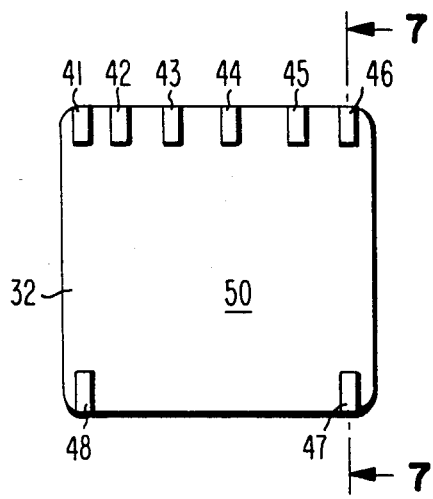
FIG. 6 is a plan view of the cover of FIG. 3.
Figure 8:
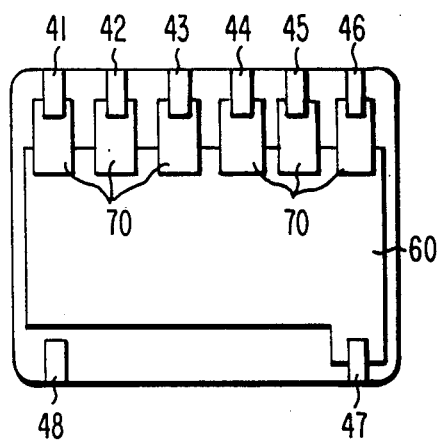
FIG. 8 is a view similar to that of FIG. 6 with a portion of the top insulating layer removed.
Figure 7:
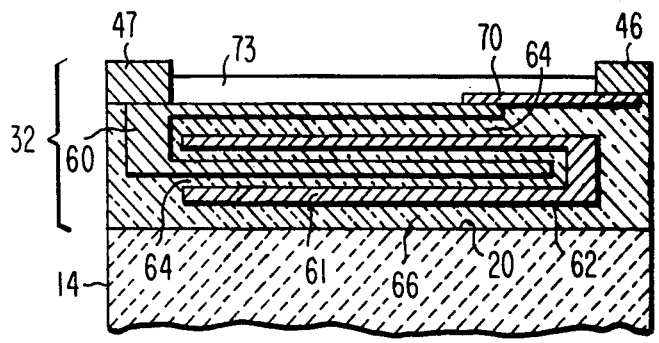
FIG. 7 is a sectional view taken along the lines 7—7 of FIG. 6.

The composite layer 32, as shown in FIG. 6, includes eight electrical contacts 41 through 48 which correspond to the terminal points 1 through 8, respectively, of the passive circuit shown in FIG. 5. The contacts 41 through 48 are disposed on the top most surface 50 of the composite layer 32 and may be made of any suitable electrically conductive material such as noble or refractory metals, copper, or aluminum. The cross-sectional view of FIG. 7 shows the internal structure of the composite layer 32 including a pair of interleaved plates 60 and 62 which correspond to the two plates of the capacitor C1 shown schematically in FIG. 5. The plates 60, 62 may be of any suitable thin or thick film conductive material such as noble or refractory metals, copper, or aluminum or they may be layers of doped silicon or a thick film conductive frit. The composite layer 32 may be made in any one of a variety of ways. For example, alternate layers of thick film dielectric frit and thick film conductive frit may be silk screen printed on the surface 20 to form the capacitor plates 60 and 62 and surrounding dielectric 64, as shown in FIG. 7. The resistor elements 70 may then be formed by silk screen printing of a thick film resistive frit followed by formation of the passivation layer 73 and the contacts 41 through 48 in the usual manner. The plates 60, 62 are mutually insulated by a layer 64 of suitable dielectric such as glass or ceramic, as best seen in FIG. 7. If the body 14 is made of an electrically conductive material, then a layer 66 of insulating material would normally be disposed between the plate 62 and the body 14. Six resistor elements 70, as shown in FIGS. 7 and 8, have one end of each in electrical contact with a portion 72 of the top most plate 60 of the capacitor C1 and have their other ends in electrical contact with the contacts 41 through 46, respectively. The resistor elements 70 correspond to the resistors R1 through R6 shown schematically in FIG. 5. The resistor elements 70 may be of any suitable thick or thin film or monolithic layers that are well known in the art such as, metal, resistive frit ink, or doped silicon. A passivation layer 73 of phosphate silicate glass (PSG), ceramic, or other suitable insulating material may be disposed over the top portion of the plate 60 and the resistor elements 70 as shown in FIG. 7.

Figure 9:
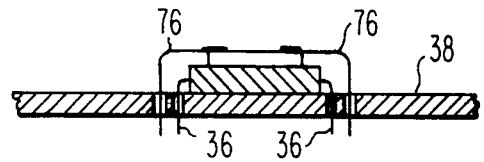
FIG. 9 is a sectional view taken along the lines 9—9 of FIG. 4.

As shown in FIGS. 4 and 9, a plurality of terminals or terminal leads 76 are electrically connected to the contacts 41 through 48 by any suitable means such as welding, brazing, or soldering. As best seen in FIG. 9, the terminals 76 may be L shaped, having their free ends adjacent some of the leads 36 of the semiconductor package 34. These free ends extend through holes in the printed circuit board 38 and, as with the leads 36, are soldered in place. Conductors, not shown, on the printed circuit board 38 interconnect the terminals 76 of the passive circuit contained in the composite layer 32 with some of the leads 36 and other terminals or devices that may be included on the printed circuit board 38.

This arrangement permits complete flexibility in interconnecting the passive circuit terminals 76 to the package leads 36 or other circuit components on the interconnection medium. This can be a substantial advantage when different applications for a given integrated circuit device have correspondingly different passive circuit requirements. Another very substantial advantage of this structure is that the space which was formerly required for mounting the passive circuit components on the printed circuit board or other interconnection medium is space that is no longer needed resulting in a more compact end product.

I claim:
1. A cover covering a semiconductor package, said semiconductor package including a plurality of leads adapted for making electrical contact with an electrical circuit external to said semiconductor package, said cover comprising,
    (a) a body having a major surface which is substantially planar and an attaching surface opposite said planar surface for attaching said body to said semiconductor package;
    (b) a composite layer containing a passive circuit and including at least one electrical contact, said composite layer disposed on said major surface; and
    (c) a terminal attached to said electrical contact not in direct or indirect electrical contact through said semiconductor package with said semiconductor package including said leads and adapted for making electrical contact to said electrical circuit external to said semiconductor package independently of said leads.

2. The cover set forth in claim 1 wherein said passive circuit contains at least a capacitor and a resistor.

3. The cover set forth in claim 2 wherein said resistor comprises a layer of resistive material having first and second spaced electrical contacts associated therewith, and wherein said capacitor comprises a pair of conductive layers separated by a layer of dielectric material, one of said pair of conductive layers having a third contact associated therewith and the other of said pair of conductive layers having a fourth contact associated therewith.

4. The cover set forth in claim 3, including separate terminals attached to each of said first, second third and fourth contacts, respectively, said first, second, third and fourth contacts not being in direct or indirect electrical contact through said semiconductor package with said semiconductor package.

5. The cover set forth in claim 4 wherein a portion of said body is metal and said passive circuit is electrically insulated from said portion of said body.

6. The cover set forth in claim 5 wherein one of said pair of conductive layers of said capacitor is metal.

7. The cover set forth in claim 5 wherein said resistive material is a layer of thick film resistive frit and one of said pair of conductive layers of said capacitor is a layer of thick film conductive frit.

8. The cover set forth in claim 1 wherein said passive circuit contains at least one of a capacitor and a resistor.

* * * * *